United States Patent
Tseng et al.

(10) Patent No.: US 8,563,363 B2
(45) Date of Patent: Oct. 22, 2013

(54) FABRICATING METHOD OF SEMICONDUCTOR PACKAGE STRUCTURE

(75) Inventors: Tzyy-Jang Tseng, Hsinchu (TW); Chin-Sheng Wang, Hsinchu (TW); Chih-Hong Chuang, Hsinchu (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 13/590,847

(22) Filed: Aug. 21, 2012

(65) Prior Publication Data

US 2013/0011971 A1    Jan. 10, 2013

Related U.S. Application Data

(62) Division of application No. 12/915,514, filed on Oct. 29, 2010, now Pat. No. 8,390,013.

(30) Foreign Application Priority Data

Jul. 8, 2010  (TW) ................................ 99122521 A

(51) Int. Cl.
   *H01L 21/00*   (2006.01)
(52) U.S. Cl.
   USPC .................... 438/118; 438/122; 438/E21.499

(58) Field of Classification Search
   USPC .................... 438/118, 122, E21.499
   See application file for complete search history.

(56) References Cited

U.S. PATENT DOCUMENTS

| | | | |
|---|---|---|---|
| 6,625,028 B1 * | 9/2003 | Dove et al. | 361/707 |
| 7,741,158 B2 * | 6/2010 | Leung et al. | 438/122 |
| 8,329,510 B2 * | 12/2012 | Lin et al. | 438/118 |
| 2004/0065894 A1 * | 4/2004 | Hashimoto et al. | 257/100 |

* cited by examiner

*Primary Examiner* — Phat X Cao
(74) *Attorney, Agent, or Firm* — J.C. Patents

(57) ABSTRACT

A fabricating method of a semiconductor package structure is provided. A dielectric layer having a first surface and a second surface is provided. A patterned metal layer has been formed on the first surface of the dielectric layer. An opening going through the first and the second surfaces is formed. A carrier having a third surface and a fourth surface is formed at the second surface. A portion of the third surface is exposed by the opening of the dielectric layer. A semiconductor die having a joining surface and a side-surface is joined in the opening. At least a through hole going through the third and the fourth surfaces is formed. A metal layer having at least a heat conductive post extending from the fourth surface of the carrier to the through hole and disposed in the through hole and a containing cavity is formed on the fourth surface.

14 Claims, 13 Drawing Sheets

FABRICATING METHOD OF SEMICONDUCTOR PACKAGE STRUCTURE

CROSS-REFERENCE TO RELATED APPLICATION

This application is a divisional of and claims the priority benefit of U.S. application Ser. No. 12/915,514, filed on Oct. 28, 2010, now pending, which claims the priority benefit of Taiwan application serial no. 99122521, filed on Jul. 8, 2010. The entirety of the above-mentioned patent applications is hereby incorporated by reference herein and made a part of specification.

BACKGROUND OF THE INVENTION

1. Field of the Invention

The invention generally relates to a package structure and a fabricating method thereof, and more particularly, to a package and the carrier structure thereof and a fabricating method thereof with demand on high heat conduction performing.

2. Description of Related Art

The purpose of chip package is to provide a chip with an appropriate signal path, a heat conduction path and structure protection. The traditional wire bonding technique usually adopts a leadframe as a carrier of the chip. Along with gradually increasing the bonding point density of a chip, the leadframe is unable to provide a higher bonding point density, so that it is replaced by a package substrate with high bonding point density, where the chip is packed onto the package substrate through conductive media such as metal wires or bumps.

In general speaking, an adhesive layer conformed to the chip would be disposed between the chip and the package substrate. The chip is fixed on the package substrate through the adhesive layer. The heat produced by the chip would be transferred to the package substrate through the adhesive layer so as to conduct heat. When paste, for example a silver epoxy, is used as the material of the adhesive layer, due to the poor thermal conducting rate (less than 20 W/mK), high coefficient of thermal expansion (CTE) (greater than 30 ppm/K) and poor adhering strength of the silver epoxy, so that when the heat produced by the chip is transferred to the package substrate through the adhesive layer, an increasing thermal resistance is caused by the adhesive layer, which further leads to poor heat conduction and decrease the strength of the adhesive layer and even destroy the adhesive layer when thermal stress occurs. Hence, how to make the heat produced by the chip more efficiently transferred to outside has become one of development tasks for the designers.

SUMMARY OF THE INVENTION

Accordingly, the invention is directed to a semiconductor package structure having better heat dissipation efficiency and low CTE property.

The invention is also directed to a fabricating method of semiconductor package structure for fabricating the above-mentioned semiconductor package structure.

The invention provides a semiconductor package structure, which includes a dielectric layer, a patterned metal layer, a carrier, a metal layer and a semiconductor die. The dielectric layer has a first surface and a second surface opposite to each other and an opening going through the first surface and the second surface. The patterned metal layer is disposed on the first surface of the dielectric layer. The carrier is disposed at the second surface of the dielectric layer and has a third surface and a fourth surface opposite to each other and at least a through hole going through the third surface and the fourth surface. A portion of the third surface and the through hole are exposed by the opening of the dielectric layer. The metal layer is disposed on the fourth surface of the carrier and has at least a heat conductive post and a containing cavity, in which the heat conductive post extends from the fourth surface of the carrier to the through hole and is disposed in the through hole, an end of the heat conductive post protrudes away from the third surface of the carrier, and the containing cavity is located on the end of the heat conductive post. The semiconductor die is disposed in the opening of the dielectric layer and located in the containing cavity.

In an embodiment of the invention, the above-mentioned semiconductor package structure further includes a first adhesive layer disposed on the second surface of the dielectric layer and located between the dielectric layer and the carrier.

In an embodiment of the invention, the above-mentioned semiconductor package structure further includes a protection layer disposed on the patterned metal layer and covering the patterned metal layer.

In an embodiment of the invention, the above-mentioned semiconductor package structure further includes a stress buffer layer disposed between the containing cavity and the semiconductor die.

In an embodiment of the invention, the above-mentioned semiconductor package structure further includes a second adhesive layer disposed between the stress buffer layer and the third surface of the carrier.

In an embodiment of the invention, the above-mentioned semiconductor package structure further includes an insulation material layer with high heat conductivity disposed on a side-surface of the metal layer far away from the carrier.

In an embodiment of the invention, the above-mentioned insulation material layer with high heat conductivity includes a diamond-like carbon film layer or a ceramic material layer.

The invention also provides a fabricating method of semiconductor package structure, and the fabricating method includes following steps. A dielectric layer is provided, in which the dielectric layer has a first surface and a second surface opposite to each other, and a patterned metal layer has been formed on the first surface of the dielectric layer. An opening going through the first surface and the second surface of the dielectric layer is formed. A carrier is formed at the second surface of the dielectric layer, in which the carrier has a third surface and a fourth surface opposite to each other and a portion of the third surface is exposed by the opening of the dielectric layer. A semiconductor die is joined in the opening of the dielectric layer, in which the semiconductor die has a joining surface and a side-surface. At least a through hole going through the third surface and the fourth surface of the carrier is formed, in which the joining surface and a portion of the side-surface of the semiconductor die are exposed by the through hole. A metal layer is formed on the fourth surface of the carrier, in which the metal layer has at least a heat conductive post extending from the fourth surface of the carrier to the through hole and disposed in the through hole and a containing cavity, an end of the heat conductive post protrudes away from the third surface of the carrier, the containing cavity is located on the end of the heat conductive post and the semiconductor die is located in the containing cavity.

In an embodiment of the invention, prior to forming the opening of the dielectric layer, the above-mentioned method further includes: forming a protection layer on the patterned metal layer, in which the protection layer covers a portion of the patterned metal layer; forming a first adhesive layer on the second surface of the dielectric layer.

In an embodiment of the invention, the above-mentioned method of forming the opening of the dielectric layer includes a routing process, a punch process or a laser process.

In an embodiment of the invention, prior to joining the semiconductor die, the above-mentioned method further includes forming a second adhesive layer on the third surface of the carrier exposed by the opening of the dielectric layer, in which the second adhesive layer is located on the joining surface of the semiconductor die.

In an embodiment of the invention, the above-mentioned step of forming the through hole includes: adhering a thin film over the patterned metal layer, on a portion of the dielectric layer and a top end of the semiconductor die opposite to the joining surface of the semiconductor die; performing an etching process to form the through hole going through the fourth surface and the third surface of the carrier, in which the second adhesive layer is exposed by the through hole; performing a laser drilling process to remove the second adhesive layer and a portion of the thin film so as to expose the joining surface and a portion of the side-surface of the semiconductor die.

In an embodiment of the invention, prior to forming the metal layer, the above-mentioned method further includes forming a stress buffer layer on the joining surface and a portion of the side-surface of the semiconductor die.

In an embodiment of the invention, after forming the metal layer, the above-mentioned method further includes removing the thin film to expose the patterned metal layer, a portion of the dielectric layer and the top end of the semiconductor die of the semiconductor die.

In an embodiment of the invention, after joining the semiconductor die, the above-mentioned method further includes forming a stress buffer layer on the joining surface and a portion of the side-surface of the semiconductor die, in which the stress buffer layer is located between the second adhesive layer and the semiconductor die.

In an embodiment of the invention, the above-mentioned step of forming the through hole includes: adhering a thin film over the patterned metal layer, on a portion of the dielectric layer and on a top end of the semiconductor die opposite to the joining surface of the semiconductor die; performing an etching process to form the through hole going through the fourth surface and the third surface of the carrier, in which the second adhesive layer is exposed by the through hole; performing a laser drilling process to remove a portion of the second adhesive layer and a portion of the thin film to expose a portion of the stress buffer layer located on the joining surface of the semiconductor die and the stress buffer layer located on the portion of the side-surface of the semiconductor die.

In an embodiment of the invention, after forming the metal layer, the above-mentioned method further includes removing the thin film to expose the patterned metal layer, a portion of the dielectric layer and the top end of the semiconductor die of the semiconductor die.

In an embodiment of the invention, the above-mentioned method of forming the metal layer includes plating, physical vapor deposition (PVD), chemical vapor deposition (CVD) or pure vacuum chemical vapour deposition (PVCVD).

In an embodiment of the invention, after forming the metal layer on the fourth surface of the carrier, the above-mentioned method further includes performing a wire bonding process so that the semiconductor die is electrically connected to the patterned metal layer through at least a wire.

In an embodiment of the invention, after forming the metal layer on the fourth surface of the carrier, the above-mentioned method further includes forming an insulation material layer with high heat conductivity on a side-surface of the metal layer far away from the carrier.

Based on the depiction above, since the semiconductor die of the invention is disposed in the containing cavity located on an end of the heat conductive post, so that the heat produced by the semiconductor die can be fast transferred to outside directly through the heat conductive post and the carrier under the semiconductor die. As a result, the semiconductor package structure of the invention has a better heat dissipation efficiency.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
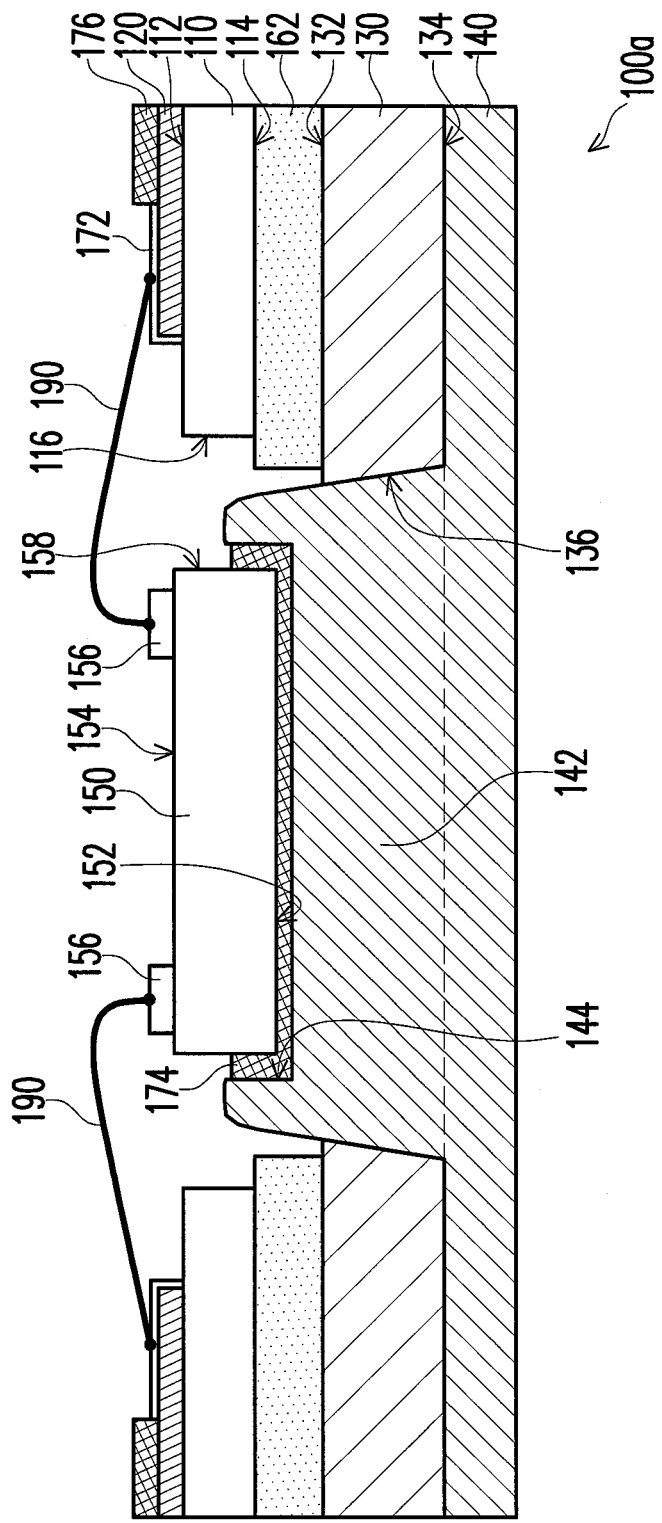
FIG. 1 is a cross-sectional diagram of a semiconductor package structure according to an embodiment of the invention.

FIG. 1 is a cross-sectional diagram of a semiconductor package structure according to an embodiment of the invention. Referring to FIG. 1, in the embodiment, a semiconductor package structure 100a includes a dielectric layer 110, a patterned metal layer 120, a carrier 130, a metal layer 140 and a semiconductor die 150.

In more details, the dielectric layer 110 has a first surface 112 and a second surface 114 opposite to the first surface 112 and an opening 116, in which the opening 116 goes through the first surface 112 and the second surface 114. The patterned metal layer 120 is disposed on the first surface 112 of the dielectric layer 110, in which the patterned metal layer 120 exposes the first surface 112 of a portion of the metal layer 110. In the embodiment, the patterned metal layer 120 can serve as the bonding pad for a successive wire bonding process. The carrier 130 is disposed at the second surface 114 of the dielectric layer 110 and has a third surface 132 and a fourth surface 134 opposite to the third surface 132 and at least a through hole 136 going through the third surface 132 and the fourth surface 134 (in FIG. 1, only one through hole 136 is schematically shown). A portion of the third surface 132 and the through hole 136 are exposed by the opening 116 of the dielectric layer 110, and the material of the carrier 130 is, for example, metal or non-metal.

The metal layer 140 is disposed on the fourth surface 134 of the carrier 130 and has at least a heat conductive post 142 (in FIG. 1, only one heat conductive post 142 is schematically shown) and a containing cavity 144. In particular, the heat conductive post 142 extends from the fourth surface 134 of the carrier 130 to and is disposed in the through hole 136, and an end of the heat conductive post 142 protrudes away from the third surface 132 of the carrier 130. The containing cavity 144 is located on an end of the heat conductive post 142 protruding away from the third surface 132 of the carrier 130. The semiconductor die 150 is disposed in the opening 116 of the dielectric layer 110 and has a joining surface 152, a top end of the semiconductor die 154, a plurality of bonding pads 156 and a side-surface 158. The joining surface 152 herein faces the third surface 132 of the carrier 130, the top end of the semiconductor die 154 and the joining surface 152 are opposite to each other, and the bonding pads 156 are located on the top end of the semiconductor die 154. In particular, the semiconductor die 150 of the embodiment is located in the containing cavity 144, in which a portion of the side-surface 158 of the semiconductor die 150 is exposed out of the containing cavity 144.

The semiconductor package structure 100a of the embodiment further includes a first adhesive layer 162 disposed on the second surface 114 of the dielectric layer 110 and located between the dielectric layer 110 and the carrier 130 for stably fixing the dielectric layer 110 on the carrier 130. The material of the first adhesive layer 162 is, for example, epoxy. In addition, in the embodiment, the semiconductor package structure 100a further includes a protection layer 172 and a soldering-free layer 176, in which the protection layer 172 is disposed on the patterned metal layer 120 and covers a portion of the patterned metal layer 120 for avoiding the patterned metal layer 120 from getting oxidation to affect the reliability of the successive wire (not shown) bonding. The protection layer 172 preferably is, for example, a bi-metal layer structure, composed, for example, of nickel layer and copper layer or nickel layer and silver layer. The soldering-free layer 176 is disposed on the patterned metal layer 120 and covers another portion of the patterned metal layer 120, in which the soldering-free layer 176 and the protection layer 172 are substantially co-planar.

The semiconductor package structure 100a further includes a stress buffer layer 174, in which the stress buffer layer 174 is disposed between the containing cavity 144 and the semiconductor die 150 for increasing the joining strength between the containing cavity 144 and the semiconductor die 150 to increase the reliability of the semiconductor package structure 100a. In other embodiments, the semiconductor package structure 100a can have no stress buffer layer 174, that is, the joining surface 152 of the semiconductor die 150 can be directly disposed at and contact the containing cavity 144 located at an end of the heat conductive post 142. The semiconductor die 150 of the semiconductor package structure 100a in the embodiment can be electrically connected to the protection layer 172 on the patterned metal layer 120 through at least a wire 190 (in FIG. 1, two wires are schematically shown), in which both ends of the wires 190 are respectively connected between the bonding pads 156 of the semiconductor die 150 and the patterned metal layer 120.

Since the semiconductor die 150 of the embodiment is disposed in the containing cavity 144, in which the containing cavity 144 is located on an end of the heat conductive post 142 protruding away from the third surface 132 of the carrier 130, so that the heat produced by the semiconductor die 150 can be fast transferred to outside directly through the heat conductive post 142 and the carrier 130 under the semiconductor die 150. In comparison with the prior art where the chip's heat is transferred to a package substrate through an adhesive layer, the semiconductor package structure 100a of the embodiment has better heat dissipation efficiency.

In the depiction above, the structure of the semiconductor package structure 100a of the invention is introduced, but the fabricating method of the semiconductor package structure 100a of the invention is not introduced yet. In following, taking the semiconductor package structure 100a of FIG. 1 as an example, a fabricating method of the semiconductor package structure 100a is described in details in association with FIGS. 2A-2H.

Figure 2A:
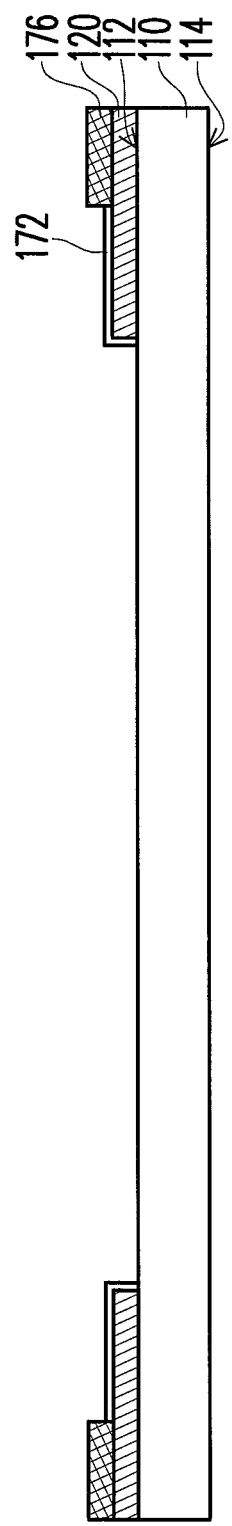
FIGS. 2A-2H are cross-sectional diagrams of a fabricating method of semiconductor package structure according to an embodiment of the invention.

FIGS. 2A-2H are cross-sectional diagrams of a fabricating method of semiconductor package structure according to an embodiment of the invention. Referring to FIG. 2A, according to the fabricating method of the semiconductor package structure 100a of the embodiment, first, a dielectric layer 110 is provided. In the embodiment, the dielectric layer 110 has a first surface 112 and a second surface 114 opposite to the first surface 112, in which a patterned metal layer 120 located on the first surface 112 has been formed on the dielectric layer 110, and a protection layer 172 and a soldering-free layer 176 have been formed on the patterned metal layer 120. The protection layer 172 and the soldering-free layer 176 are co-planed, and the protection layer 172 covers a portion of the patterned metal layer 120 for avoiding the patterned metal layer 120 from getting oxidation to further affect the reliability of the successive wire (not shown) bonding. The soldering-free layer 176 covers another portion of the patterned metal layer 120. In the embodiment, the method of forming the protection layer 172 is, for example, plating, and the protection layer 172 is, for example, a bi-metal layer structure, composed, for example, of nickel layer and copper layer or nickel layer and silver layer.

Figure 2B:
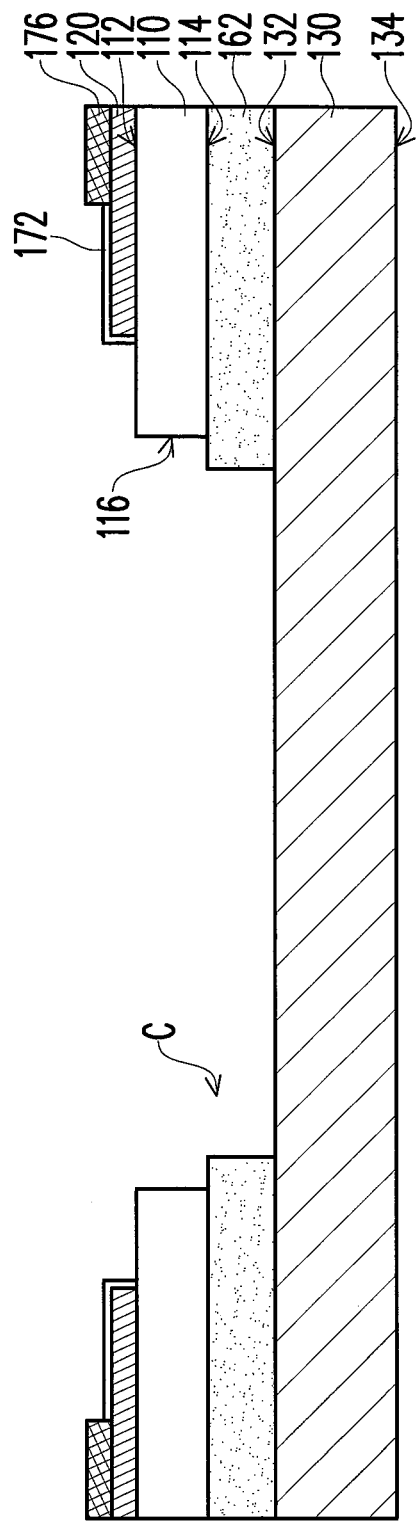

Next referring to FIG. 2B, an adhesive layer is formed on the second surface 114 of the dielectric layer 110. In the embodiment, the material of the adhesive layer is, for example, epoxy. After that, a routing process, a punch process or a laser process are conducted to form an opening 116 going through the first surface 112 and the second surface 114 of the dielectric layer 110 and a first adhesive layer 162.

Further continuing to FIG. 2B, a carrier 130 is formed on the first adhesive layer 162, in which the first adhesive layer 162 is located between the dielectric layer 110 and the carrier 130 for stably fixing the dielectric layer 110 on the carrier 130. In particular, in the embodiment, the dielectric layer 110, the first adhesive layer 162 and the carrier 130 together form a step-shaped cavity structure C. In more details, the carrier 130 has a third surface 132 and a fourth surface 134 opposite to the third surface 132, in which the opening 116 of the dielectric layer 110 exposes a portion of the third surface 132 and the first adhesive layer 162 is located on the third surface 132.

Figure 2C:
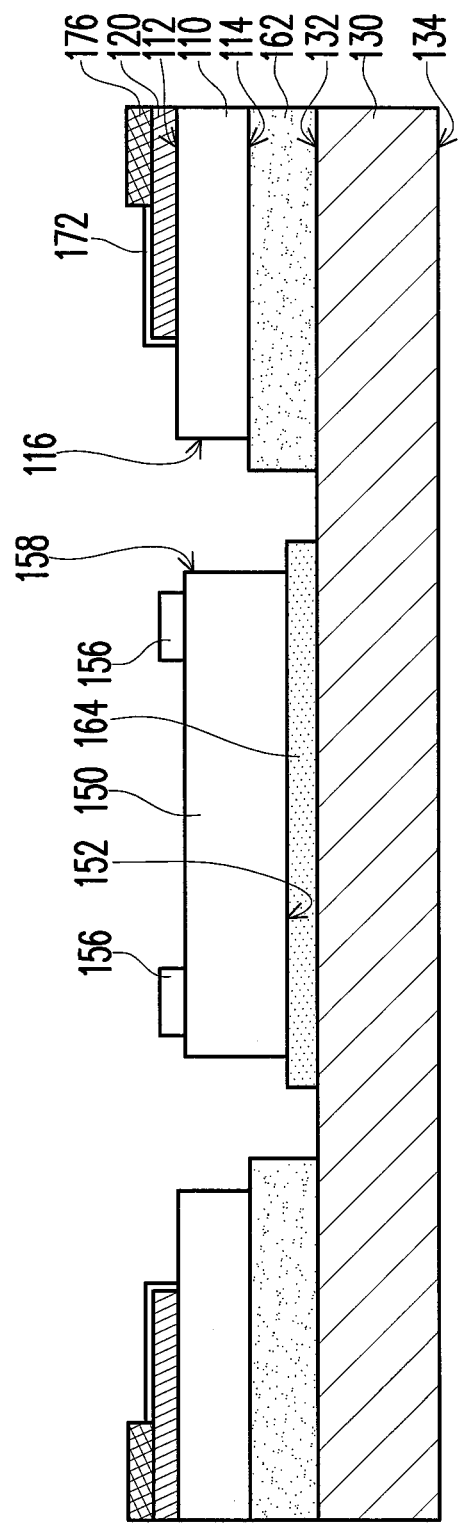

Then referring to FIG. 2C, a second adhesive layer 164 is formed on the third surface 132 of the carrier 130 exposed by the opening 116 of the dielectric layer 110, in which the material of the second adhesive layer 164 includes silver epoxy. Then, a semiconductor die 150 is joined in the opening 116 of the dielectric layer 110, in which the semiconductor die 150 has a joining surface 152, a top end of the semiconductor die 154, a plurality of bonding pads 156 and a side-surface 158. The joining surface 152 faces the third surface 132 of the carrier 130, the top end of the semiconductor die 154 and the joining surface 152 are opposite to each other, and the bonding pads 156 are located on the top end of the semiconductor die 154. The second adhesive layer 164 is located between the joining surface 152 of the semiconductor die 150 and the third surface 132 of the carrier 130 for stably fixing the semiconductor die 150 on the carrier 130.

Figure 2D:
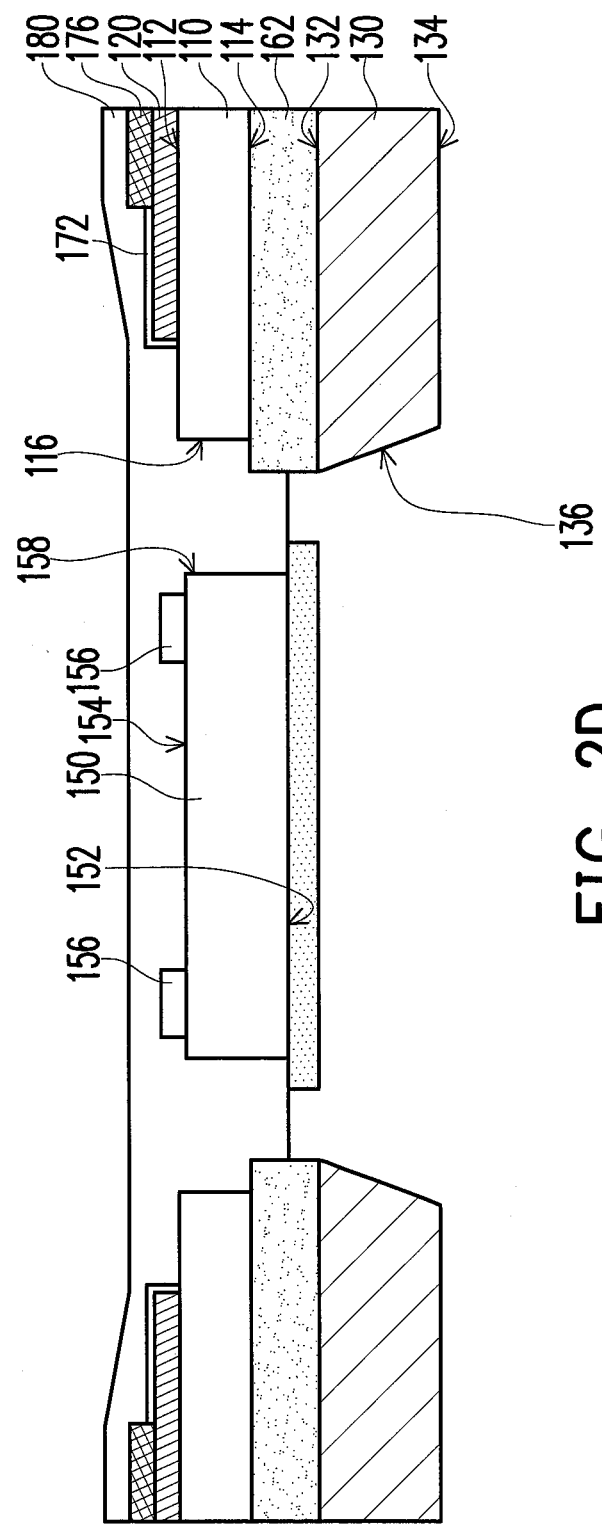

Then referring to FIG. 2D, a thin film 180 is adhered on the first protection layer 172 and the soldering-free layer 176 over the patterned metal layer 120, on the first surface 112 of a portion of the dielectric layer 110, on the top end of the semiconductor die 154 and the side-surface 158 of the semiconductor die 150 and on a portion of the second adhesive layer 164. In the embodiment, the thin film 180 is, for example, a tape.

Then referring to FIG. 2D, an etching process is conducted to form a through hole 136 (in FIG. 2H, only one through hole 136 is schematically shown) going through the fourth surface 134 and the third surface 132 of the carrier 130, in which the through hole 136 exposes the second adhesive layer 164.

Figure 2E:
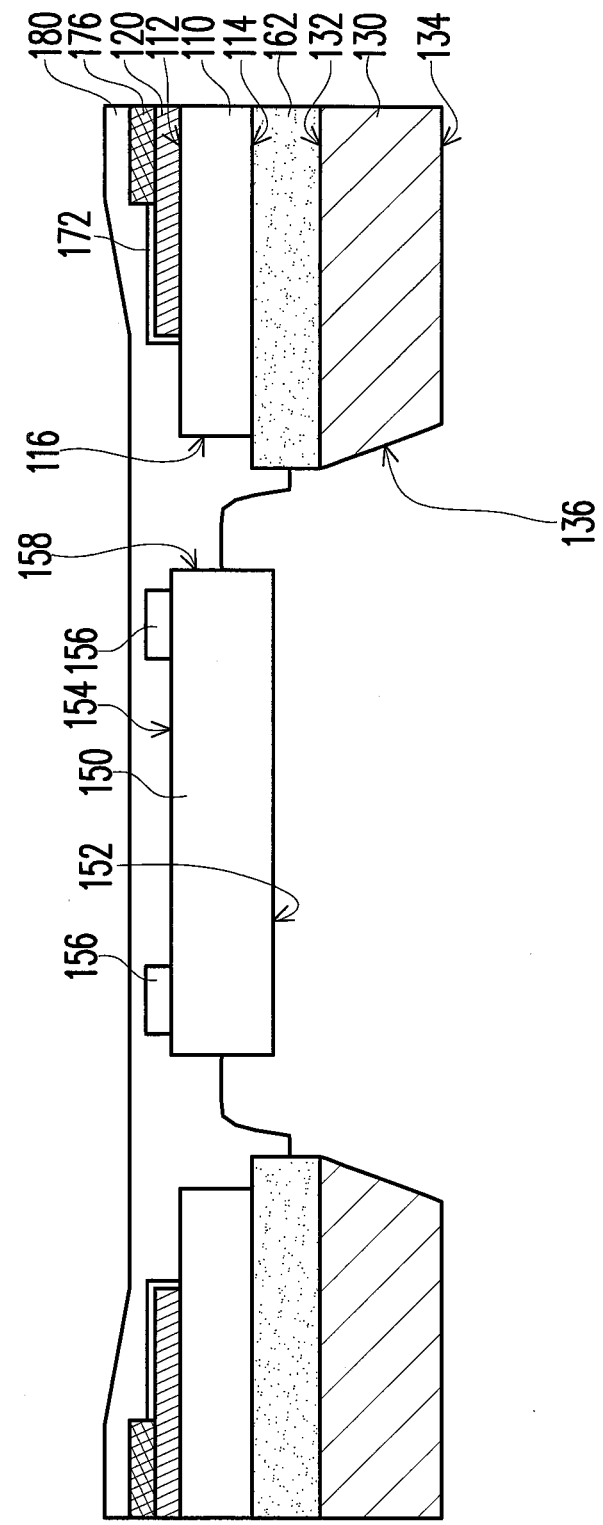

Then referring to FIG. 2E, a laser drilling process is conducted to remove the second adhesive layer 164 and a portion of the thin film 180 so that the through hole 136 exposes the joining surface 152 and a portion of the side-surface 158 of the semiconductor die 150.

Figure 2F:
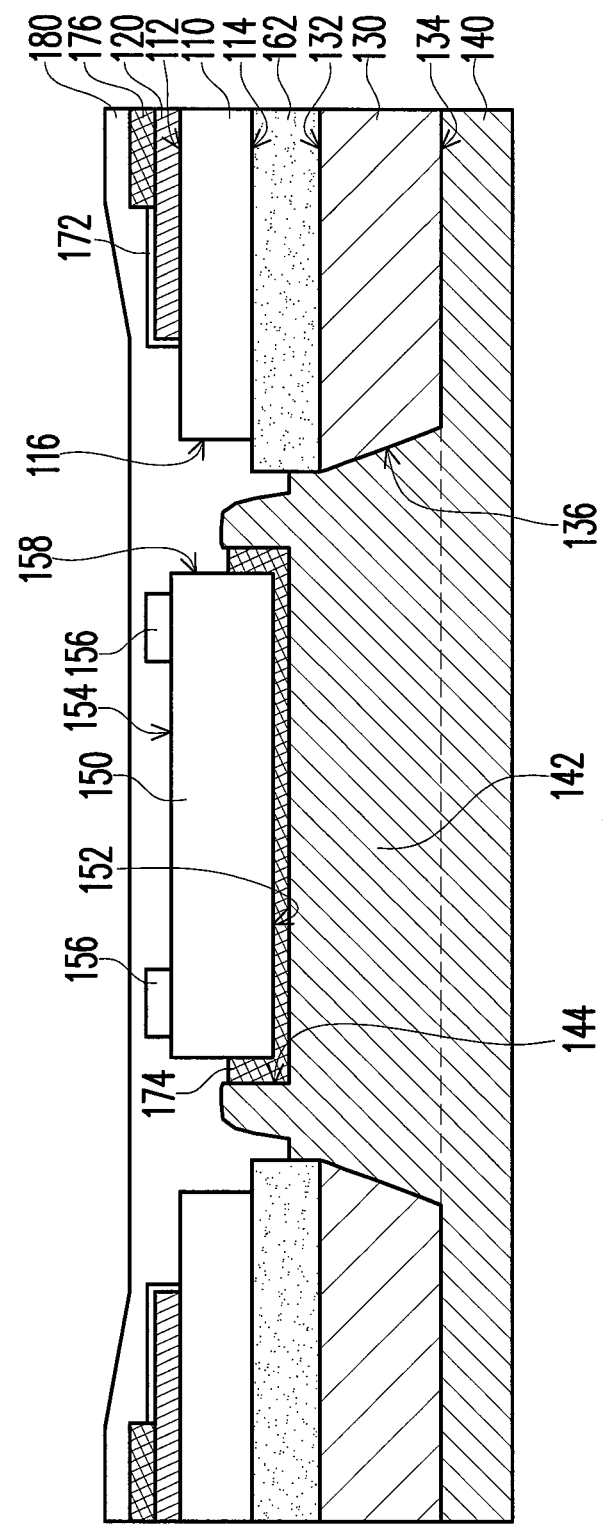

Then referring to FIG. 2F, a stress buffer layer 174 is formed on the joining surface 152 and a portion of the side-surface 158 exposed by the through hole 136 of the semiconductor die 150. Then, a metal layer 140 is formed on the fourth surface 134 of the carrier 130, in which the metal layer 140 has at least a heat conductive post 142 (in FIG. 2F, only one heat conductive post 142 is schematically shown) and a containing cavity 144. In more details, the heat conductive post 142 extends from the fourth surface 134 of the carrier 130 to and is disposed in the through hole 136, in which an end of the heat conductive post 142 protrudes away from the third surface 132 of the carrier 130. The containing cavity 144 is located on an end of the heat conductive post 142 protruding away from the third surface 132 of the carrier 130 and the semiconductor die 150 is located in the containing cavity 144. In the embodiment, the method of forming the metal layer 140 is, for example, plating, physical vapor deposition (PVD), chemical vapor deposition (CVD) or pure vacuum chemical vapour deposition (PVCVD).

Figure 2G:
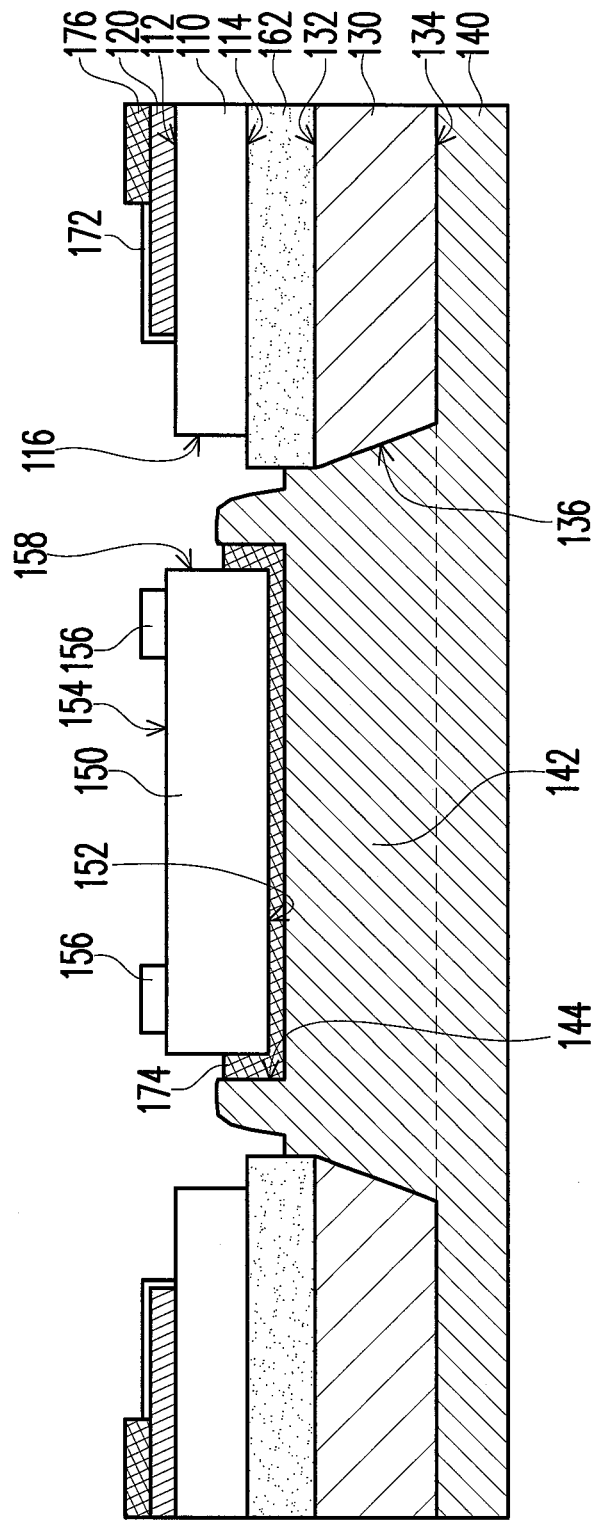

Then referring to FIG. 2G, the thin film 180 is removed to expose the protection layer 172 and the soldering-free layer 176 over the patterned metal layer 120, the first surface 112 of a portion of the dielectric layer 110, a portion of the first adhesive layer 162 and the top end of the semiconductor die 154 and the side-surface 158 of the semiconductor die 150.

Figure 2H:
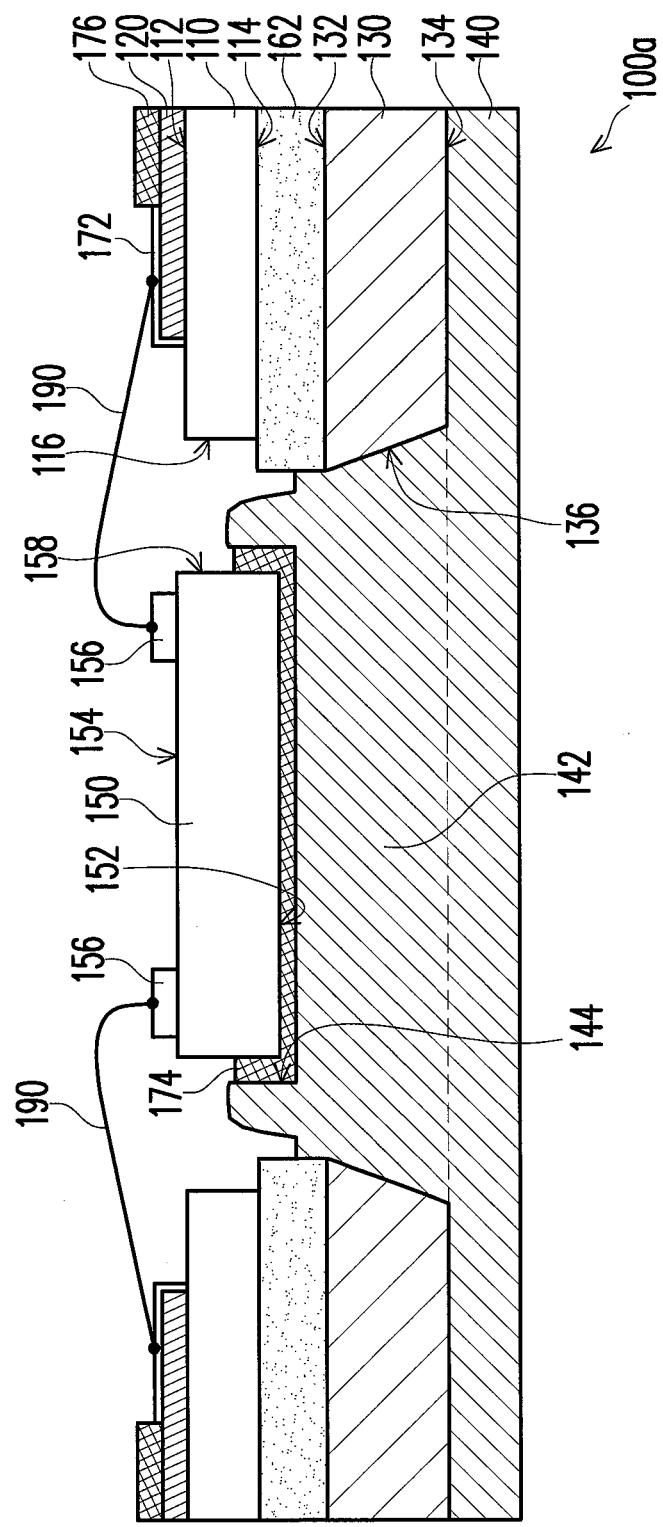

Finally referring to FIG. 2H, a wire bonding process is conducted so that the bonding pads 156 of the semiconductor die 150 are electrically connected to the protection layer 172 on the patterned metal layer 120 through at least a wire 190 (in FIG. 2H, only two wires are schematically shown). At the time, the semiconductor package structure 100a has been fabricated.

Since in the fabricating method of the semiconductor package structure 100a of the embodiment, the through hole 136 is formed and the second adhesive layer 164 is removed by performing the etching process and the laser drilling process, so that the heat conductive post 142 of the metal layer 140 can be formed in the through hole 136 and the semiconductor die 150 can be disposed in the containing cavity 144. As a result, the heat produced by the semiconductor die 150 can be fast transferred to outside directly through the heat conductive post 142 and the carrier 130 under the semiconductor die 150. In comparison with the prior art where the chip's heat is transferred to a package substrate through an adhesive layer, the semiconductor package structure 100a of the embodiment has better heat dissipation efficiency.

The process of FIGS. 2A-2H is described as an example only, in which the partial steps are common techniques in the semiconductor package process today. Anyone skilled in the art can adjust, omit or increase possible steps according to the real application so as to conform the process requirement, which is omitted to describe.

It should be noted that the following embodiment uses the component marks and partial contents of the above-mentioned embodiment, in which the same marks indicate the same or similar components and the same technical contents are omitted, and the depiction of the omitted part can refer to the above-mentioned embodiment, which is not repeated in the following embodiment.

Figure 3:
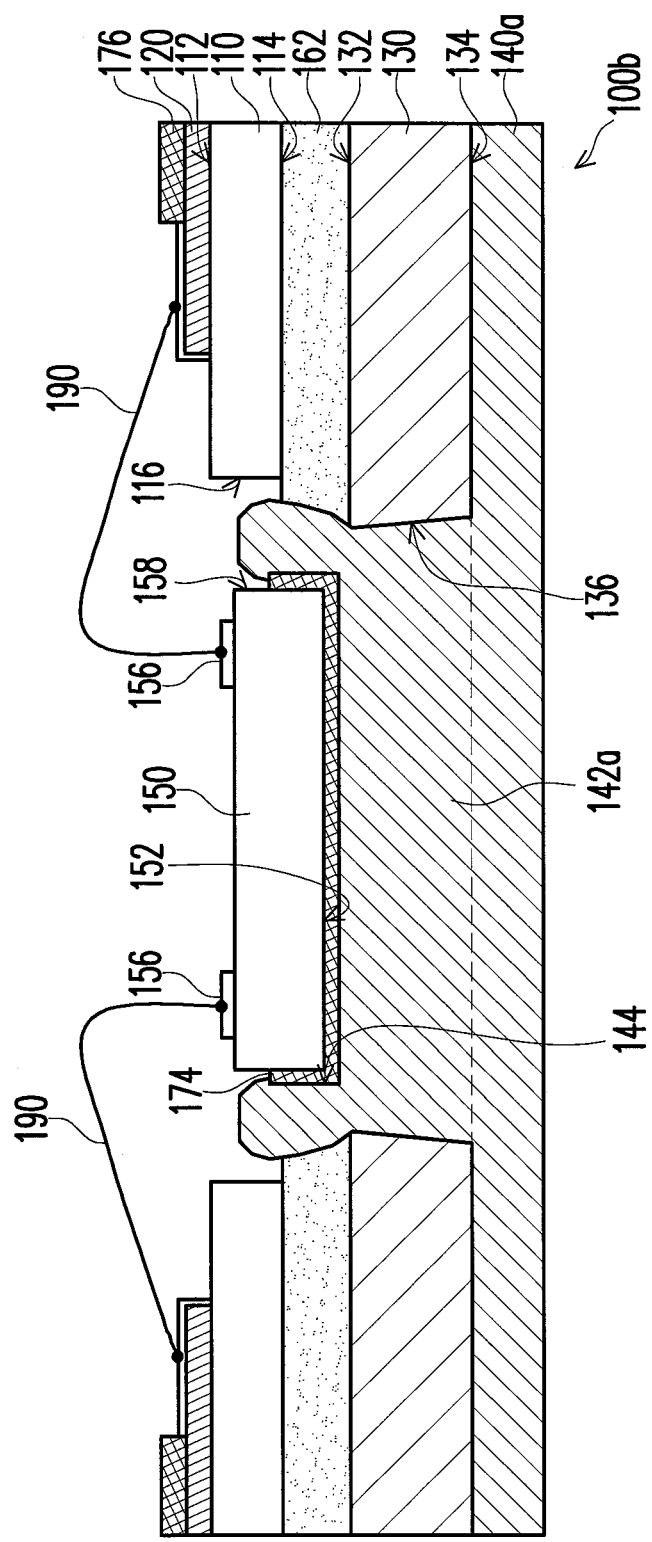
FIGS. 3-6 are cross-sectional diagrams of semiconductor package structures according to a plurality of embodiments of the invention.

FIG. 3 is a cross-sectional diagram of a semiconductor package structure according to another embodiment of the invention. Referring to FIGS. 1 and 3, the semiconductor package structure 100b of the embodiment is similar to the semiconductor package structure 100a of FIG. 1 except that the heat conductive post 142a of the metal layer 140a in the semiconductor package structure 100b protrudes away from an end of the third surface 132 of the carrier 130 and is substantially aligned with the top end of the semiconductor die 154 of the semiconductor die 150. In the embodiment, the side-surface 158 of the semiconductor die 150 is completely located in the containing cavity 144, so that the metal layer 140a has a larger area, which increases the heat conduction path of the side edge of the semiconductor die 150 and further advances the heat dissipating effect of the semiconductor package structure 100b.

Figure 4:
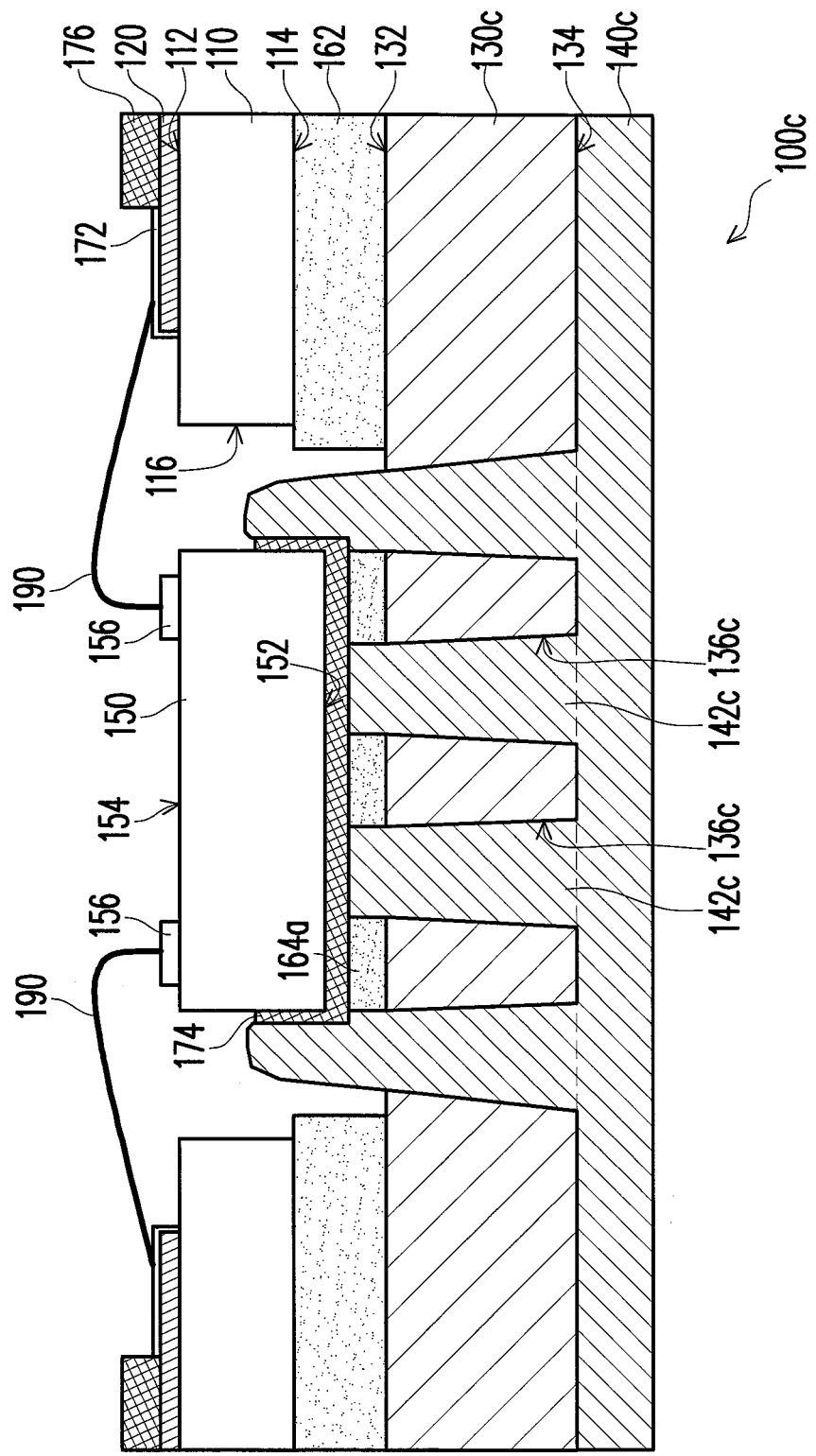

FIG. 4 is a cross-sectional diagram of a semiconductor package structure according to yet another embodiment of the invention. Referring to FIGS. 1 and 4, the semiconductor package structure 100c of the embodiment is similar to the semiconductor package structure 100a of FIG. 1 except that the semiconductor package structure 100c of FIG. 4 further includes a second adhesive layer 164a, in which the second adhesive layer 164a is located between the stress buffer layer 174 and the third surface 132 of the carrier 130c so that the semiconductor die 150 can be more stably fixed on the carrier 130c. In addition, the carrier 130c of the embodiment has a plurality of through holes 136c, and a plurality of heat conductive posts 142c of the metal layer 140c are respectively located in the through holes 136c of the carrier 130c and directly contact a portion of the stress buffer layer 174.

In terms of the process, the semiconductor package structure 100c of the embodiment can adopt roughly the similar fabrication method as the semiconductor package structure 100a of the above-mentioned embodiment. In performing the process step shown by FIG. 2C, first, the stress buffer layer 174 and the second adhesive layer 164a located on the stress buffer layer 174 and the third surface 132 of the carrier 130c are formed. Next, the process step shown by FIG. 2D is conducted, where a plurality of through holes 136c are formed to expose the second adhesive layer 164a. Then, the process step shown by FIG. 2E is conducted, where a portion of the second adhesive layer 164a and a portion of thin film 180 are removed to expose a portion of the stress buffer layer 174 on the joining surface 152 of the semiconductor die 150 and the stress buffer layer 174 located on a portion of the side-surface 158 of the semiconductor die 150. After that, the process step shown by FIG. 2F is conducted, where a plurality of heat conductive posts 142c extending from the fourth surface 134 of the carrier 130c and located in the through holes 136c are formed. Finally, the process steps of FIGS. 2G and 2H are sequentially conducted. At the time, the semiconductor package structure 100c is almost completed.

Figure 5:
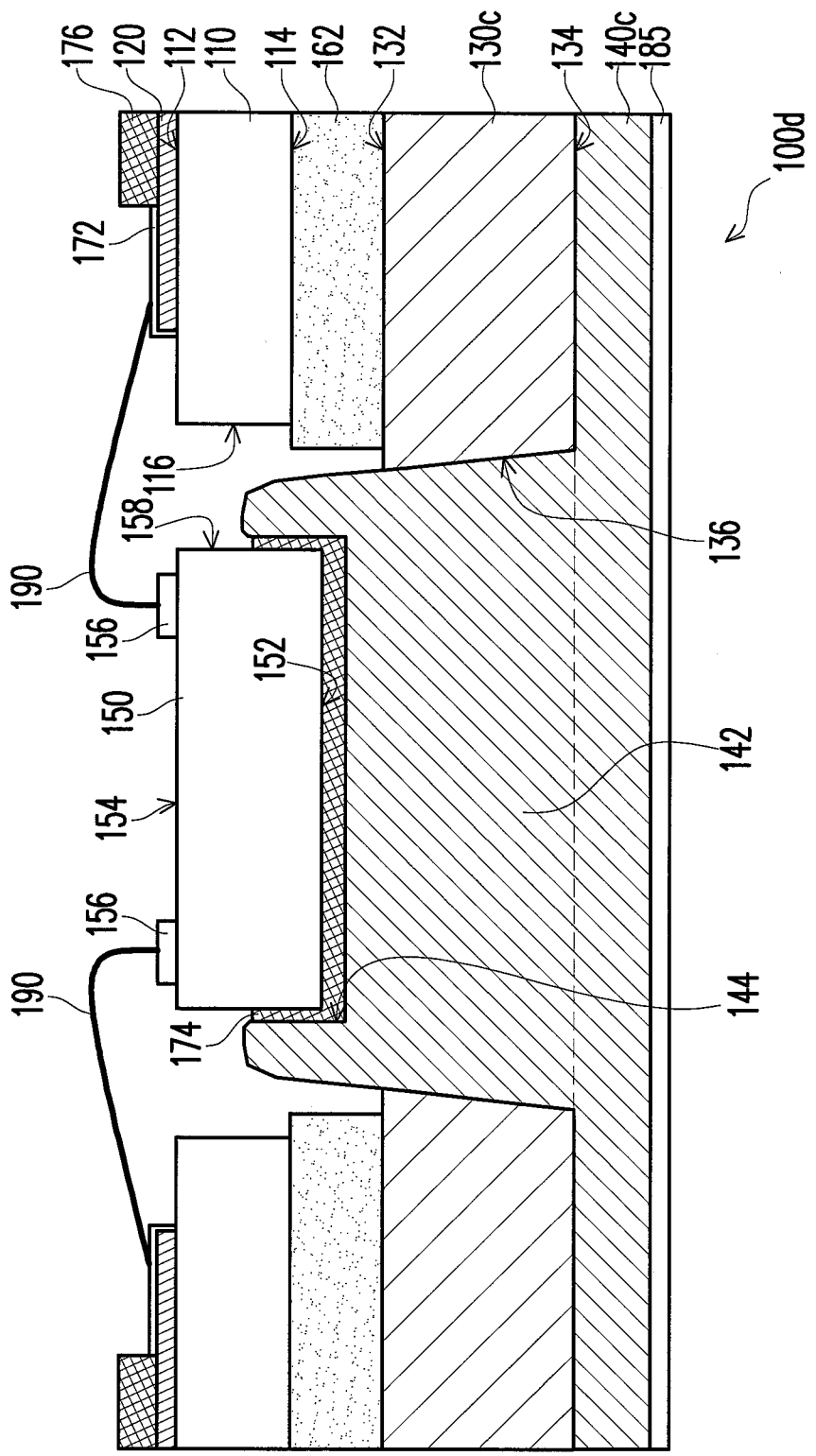

FIG. 5 is a cross-sectional diagram of a semiconductor package structure according to yet another embodiment of the invention. Referring to FIGS. 1 and 5, the semiconductor package structure 100d of the embodiment is similar to the semiconductor package structure 100a of FIG. 1 except that the semiconductor package structure 100d of FIG. 5 further includes an insulation material layer with high heat conductivity 185, in which the insulation material layer with high heat conductivity 185 is disposed on a side-surface of the metal layer 140 far away from the carrier 130. The insulation material layer with high heat conductivity 185 is, for example, a diamond-like carbon film layer or a ceramic material layer. Since the semiconductor package structure 100d of the embodiment has the insulation material layer with high heat conductivity 185, so that it can serve as a bottom insulation of the semiconductor package structure 100d, it also can better meet the heat conduction demand of the semiconductor package structure 100d.

Figure 6:
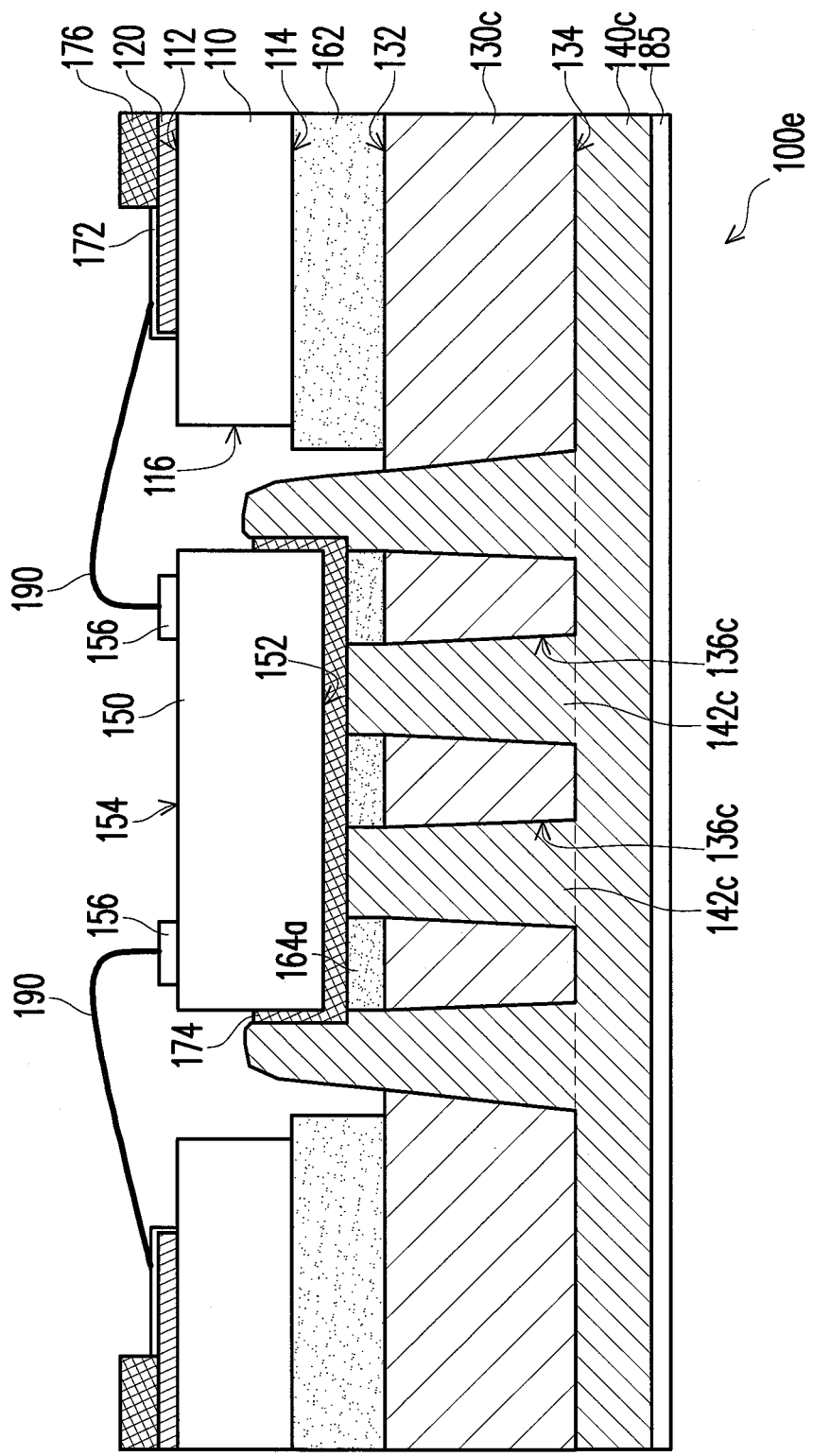

FIG. 6 is a cross-sectional diagram of a semiconductor package structure according to yet another embodiment of the invention. Referring to FIGS. 4 and 6, the semiconductor package structure 100e of the embodiment is similar to the semiconductor package structure 100c of FIG. 4 except that the semiconductor package structure 100e of FIG. 6 further includes an insulation material layer with high heat conductivity 185, in which the insulation material layer with high heat conductivity 185 is disposed on a side-surface of the metal layer 140 far away from the carrier 130. The insulation material layer with high heat conductivity 185 is, for example, a diamond-like carbon film layer or a ceramic material layer. Since the semiconductor package structure 100e of the embodiment has the insulation material layer with high heat conductivity 185, so that it can serve as a bottom insulation of the semiconductor package structure 100e, it also can better meet the heat dissipation demand of the semiconductor package structure 100e.

In summary, since the adhesive layer of the invention does not completely cover or does not cover (i.e., no adhesive layer) the joining surface of the semiconductor die and the semiconductor die is disposed in the containing cavity located on an end of the heat conductive post, so that the heat produced by the semiconductor die can be fast transferred to outside directly through the heat conductive post and the carrier under the semiconductor die. As a result, the semiconductor package structure of the invention has a better heat dissipation efficiency.

It will be apparent to those skilled in the art that the descriptions above are several preferred embodiments of the invention only, which does not limit the implementing range of the invention. Various modifications and variations can be made to the structure of the invention without departing from the scope or spirit of the invention.

What is claimed is:

1. A fabricating method of semiconductor package structure, comprising:
    providing a dielectric layer, having a first surface and a second surface opposite to each other, wherein a patterned metal layer has been formed on the first surface of the dielectric layer;
    forming an opening going through the first surface and the second surface of the dielectric layer;
    forming a first adhesive layer on the second surface of the dielectric layer prior to forming the opening of the dielectric layer;
    forming a carrier at the second surface of the dielectric layer, wherein the carrier has a third surface and a fourth surface opposite to each other and a portion of the third surface is exposed by the opening of the dielectric layer, and the first adhesive layer is located between the dielectric layer and the carrier for stably fixing the dielectric layer on the carrier;
    joining a semiconductor die in the opening of the dielectric layer, wherein the semiconductor die has a joining surface and a side-surface;
    forming a second adhesive layer on the third surface of the carrier exposed by the opening of the dielectric layer prior to joining the semiconductor die, wherein the second adhesive layer is located on the joining surface of the semiconductor die;
    forming at least a through hole going through the third surface and the fourth surface of the carrier, wherein the joining surface and a portion of the side-surface of the semiconductor die are exposed by the through hole; and
    forming a metal layer on the fourth surface of the carrier, wherein the metal layer has at least a heat conductive post extending from the fourth surface of the carrier to the through hole and disposed in the through hole and a containing cavity, an end of the heat conductive post protrudes away from the third surface of the carrier, the containing cavity is located on the end of the heat conductive post and the semiconductor die is located in the containing cavity;
    forming a stress buffer layer on the joining surface and a portion of the side-surface of the semiconductor die prior to forming the metal layer.

2. The fabricating method of semiconductor package structure as claimed in claim 1, wherein prior to forming the opening of the dielectric layer, the method further comprises:
    forming a protection layer on the patterned metal layer, wherein the protection layer covers a portion of the patterned metal layer.

3. The fabricating method of semiconductor package structure as claimed in claim 1, wherein the method of forming the opening of the dielectric layer comprises a routing process, a punch process or a laser process.

4. The fabricating method of semiconductor package structure as claimed in claim 1, wherein the step of forming the through hole comprises:
    adhering a thin film over the patterned metal layer, on a portion of the dielectric layer and a top end of the semiconductor die opposite to the joining surface of the semiconductor die;
    performing an etching process to form the through hole going through the fourth surface and the third surface of the carrier, wherein the second adhesive layer is exposed by the through hole; and
    performing a laser drilling process to remove the second adhesive layer and a portion of the thin film so as to expose the joining surface and a portion of the side-surface of the semiconductor die.

5. The fabricating method of semiconductor package structure as claimed in claim 4, wherein after forming the metal layer, the method further comprises removing the thin film to expose the patterned metal layer, a portion of the dielectric layer and the top end of the semiconductor die of the semiconductor die.

6. The fabricating method of semiconductor package structure as claimed in claim 1, wherein after joining the semiconductor die, the method further comprises:
    forming a stress buffer layer on the joining surface and a portion of the side-surface of the semiconductor die, wherein the stress buffer layer is located between the second adhesive layer and the semiconductor die.

7. The fabricating method of semiconductor package structure as claimed in claim 6, wherein the step of forming the through hole comprises:
    adhering a thin film over the patterned metal layer, on a portion of the dielectric layer and on a top end of the semiconductor die opposite to the joining surface of the semiconductor die;

performing an etching process to form the through hole going through the fourth surface and the third surface of the carrier, wherein the second adhesive layer is exposed by the through hole; and performing a laser drilling process to remove a portion of the second adhesive layer and a portion of the thin film to expose a portion of the stress buffer layer located on the joining surface of the semiconductor die and the stress buffer layer located on the portion of the side-surface of the semiconductor die.

8. The fabricating method of semiconductor package structure as claimed in claim 7, wherein after forming the metal layer, the method further comprises removing the thin film to expose the patterned metal layer, a portion of the dielectric layer and the top end of the semiconductor die of the semiconductor die.

9. The fabricating method of semiconductor package structure as claimed in claim 1, wherein the method of forming the metal layer comprises plating, physical vapor deposition (PVD), chemical vapor deposition (CVD) or pure vacuum chemical vapour deposition (PVCVD).

10. The fabricating method of semiconductor package structure as claimed in claim 1, wherein after forming the metal layer on the fourth surface of the carrier, the method further comprises performing a wire bonding process so that the semiconductor die is electrically connected to the patterned metal layer through at least a wire.

11. The fabricating method of semiconductor package structure as claimed in claim 1, wherein after forming the metal layer on the fourth surface of the carrier, the method further comprises forming an insulation material layer with high heat conductivity on a side-surface of the metal layer far away from the carrier.

12. The fabricating method of semiconductor package structure as claimed in claim 2, wherein the heat conductive post covers a portion of a side surface of the first adhesive layer.

13. The fabricating method of semiconductor package structure as claimed in claim 2, wherein the heat conductive post does not cover a side surface of the first adhesive layer.

14. The fabricating method of semiconductor package structure as claimed in claim 2, wherein the heat conductive post completely covers a side surface of the first adhesive layer.

* * * * *